 United States Patent [19]
Watanabe et al.

[11] Patent Number: 6,153,898
[45] Date of Patent: Nov. 28, 2000

[54] FERROELECTRIC CAPACITOR, METHOD OF MANUFACTURING SAME AND MEMORY CELL USING SAME

[75] Inventors: Koji Watanabe; Masahiro Tanaka, both of Kanagawa, Japan

[73] Assignee: Sony Corporation, Tokyo, Japan

[21] Appl. No.: 09/111,686

[22] Filed: Jul. 8, 1998

[30] Foreign Application Priority Data

Jul. 9, 1997 [JP] Japan ................................. 9-184147

[51] Int. Cl.$^7$ .................................................. H01L 29/76
[52] U.S. Cl. .......................... 257/295; 257/310; 438/3; 438/240
[58] Field of Search ................... 257/295, 310; 438/3, 240

[56] References Cited

U.S. PATENT DOCUMENTS

| | | | |
|---|---|---|---|
| 5,736,759 | 4/1998 | Haushalter | 257/295 |
| 5,833,745 | 11/1998 | Atsuki et al. | 106/287.18 |
| 5,994,153 | 11/1999 | Nagel et al. | 438/3 |
| 6,043,526 | 3/2000 | Ochiai | 257/295 |

*Primary Examiner*—J. Carroll
*Attorney, Agent, or Firm*—Hill & Simpson

[57] ABSTRACT

A ferroelectric capacitor and a method of manufacturing the same are provided for reducing a crystal grain size while maintaining excellent ferroelectric properties so as to achieve a reduction in device size. A lower electrode, a ferroelectric layer and an upper electrode are formed on a substrate. The ferroelectric layer is formed into a plurality of stacked layers including an oxide of a layered crystal structure ($Bi_x(Sr, Ca, Ba)_y(Ta, Nb)_2O_{9\pm d}$). Proportion 'y' of (Sr, Ca, Ba) in at least one of the layers is different from those of the other layers. That is, a variation in proportion 'y' of (Sr, Ca, Ba) is provided in the ferroelectric layer. As a result, excellent ferroelectric properties are obtained and the crystal grain size of the oxide is reduced.

21 Claims, 7 Drawing Sheets

FERROELECTRIC CAPACITOR, METHOD OF MANUFACTURING SAME AND MEMORY CELL USING SAME

BACKGROUND OF THE INVENTION

1. Field of the Invention

The present invention relates to a ferroelectric capacitor comprising a ferroelectric layer including a bismuth (Bi) compound oxide of a layered crystal structure, a method of manufacturing the same and a memory cell using the same.

2. Description of the Related Art

With advances in layer formation technology, considerable research and development has been carried out on a non-volatile memory using a ferroelectric thin film. Such a non-volatile memory is a non-volatile ferroelectric random access memory (FeRAM) reprogrammable at high speed through the use of high speed polarization inversion and residual polarization of a ferroelectric thin film. It is a merit of an FeRAM that programmed data is not erased in contrast to a volatile memory whose programmed data is erased on powering off. One of materials making up such an FeRAM is a bismuth compound oxide of a layered crystal structure. Such a bismuth compound oxide is an attractive material since a fatigue phenomenon is reduced therein. The fatigue phenomenon is a reduction in residual polarization value due to repeated reprogramming, which is the greatest demerit of a PZT base material, a solid solution of $PbTiO_3$ and $PbZrO_3$ which has been used in the art. For an application to FeRAM, it has been reported that formation of polycrystalline thin film of bismuth compound oxide is achieved.

However, a polycrystalline thin film includes not only crystal grains whose orientations contribute to ferroelectricity but also grains that do not contribute to ferroelectricity at all depending on the direction of voltage application. It is therefore required that many crystal grains are included for stably obtaining a desirable residual polarization value (Pr) in forming an FeRAM with a polycrystalline thin film. In particular, a smaller grain size is preferred for reducing the area of thin film with an advance in formation of high density and high integration FeRAM.

A related-art polycrystalline thin film of bismuth compound oxide of a layered crystal structure consisting of bismuth, strontium (Sr), tantalum (Ta) and oxygen (O) has been achieved whose residual polarization value (2Pr) is approximately 20 $\mu C/cm^2$ and a mean surface area of the crystal grains is approximately 0.05 $\mu m^2$ as disclosed in T. Atsuki et al., Jpn. J. Appl. Phys. Vol. 34 (1995) pp. 5096–5099. However, approximately twenty grains in such a size are only included if the surface area of thin film is reduced down to nearly 1 $\mu m^2$. Consequently it may be difficult to achieve desired ferroelectric properties. It is thus required to further reduce the grain size. An adjustment to the formula is considered for grain size reduction since a grain size relates to the formula.

However, the formula closely relates to ferroelectric properties as well. Therefore, ferroelectric properties are sacrificed for grain size reduction through a formula adjustment. On the contrary, grain size reduction is not achieved with an improvement in ferroelectric properties. For example, in a polycrystalline thin film of bismuth compound oxide of a layered crystal structure consisting of bismuth, strontium, tantalum and oxygen, desirable ferroelectric properties are obtained when the proportion of strontium is of a value less than the stoichiometric composition by 20 percent. However, the crystal grain size increases on the contrary while ferroelectric properties improve with the strontium proportion approaches the value (T. Atsuki et al., Jpn. J. Appl. Phys. Vol. 34 (1995) pp. 5096–5099; T. Noguchi et al., Jpn. Appl. Phys. Vol. 35 (1996) pp. 4900–4904 and so on). That is, simply adjusting the formula does not allow the crystal grain size to be reduced while maintaining satisfactory ferroelectric properties. A reduction in FeRAM size is not achieved, either.

SUMMARY OF THE INVENTION

It is an object of the invention to provide a ferroelectric capacitor, a method of manufacturing the same and a memory cell using the same for achieving reduction in device size through reducing a crystal grain size while maintaining satisfactory ferroelectric properties.

A ferroelectric capacitor of the invention comprises a ferroelectric layer to which a pair of electrodes are connected. The ferroelectric layer includes an oxide of a layered crystal structure consisting of bismuth, at least one first element selected from the group consisting of strontium, calcium (Ca) and barium (Ba), at least one second element selected from the group consisting of tantalum and niobium (Nb), and oxygen. A formula of the oxide is represented by $Bi_x(Sr, Ca, Ba)_y(Ta, Nb)_2O_{9\pm d}$ where $1.70 \leq x \leq 2.50$, $0.60 \leq y \leq 1.20$ and $0 \leq d \leq 1.00$. There is a variation in proportion of the first element in the ferroelectric layer.

A method of the invention is provided for manufacturing a ferroelectric capacitor comprising a ferroelectric layer to which a pair of electrodes are connected. The ferroelectric layer includes an oxide of a layered crystal structure consisting of bismuth, at least one first element selected from the group consisting of strontium, calcium and barium, at least one second element selected from the group consisting of tantalum and niobium, and oxygen. A formula of the oxide is represented by $Bi_x(Sr, Ca, Ba)_y(Ta, Nb)_2O_{9\pm d}$ where $1.70 \leq x \leq 2.50$, $0.60 \leq y \leq 1.20$ and $0 \leq d \leq 1.00$. The method includes the step of forming the ferroelectric layer by stacking a plurality of layers including the oxide wherein a proportion of the first element in at least one of the plurality of layers is different from those in the other layers.

A memory cell of the invention includes a ferroelectric capacitor comprising a ferroelectric layer to which a pair of electrodes are connected. The ferroelectric layer includes an oxide of the layered crystal structure consisting of bismuth, at least one first element selected from the group consisting of strontium, calcium and barium, at least one second element selected from the group consisting of tantalum and niobium, and oxygen. A formula of the oxide is represented by $Bi_x(Sr, Ca, Ba)_y(Ta, Nb)_2O_{9\pm d}$ where $1.70 \leq x \leq 2.50$, $0.60 \leq y \leq 1.20$ and $0 \leq d \leq 1.00$. There is a variation in proportion of the first element in the ferroelectric layer.

In the ferroelectric capacitor of the invention, polarization takes place in the ferroelectric layer when voltage is applied between the pair of electrodes. Polarization occurs in crystal grains having specific orientations in the oxide included in the ferroelectric layer. Since there is a variation in proportion of the first element in the ferroelectric layer, excellent ferroelectric properties are achieved and the grain size in the oxide is reduced. As a result, the ferroelectric capacitor stably exhibits excellent ferroelectric properties with its size reduced.

In the method of manufacturing the ferroelectric capacitor of the invention, the ferroelectric layer is formed into a plurality of stacked layers. The proportion of the first element in at least one of the layers is different from those of the other layers.

In the memory cell of the invention, on the application of a voltage to the pair of electrodes of the ferroelectric capacitor, polarization takes place in crystal grains having specific orientations in the oxide of layered crystal structure included in the ferroelectric layer. The voltage-polarization characteristic has hysteresis. Data storage and readout is performed through the use of hysteresis. Since there is a variation in proportion of the first element in the ferroelectric layer, the memory cell operates in good condition with excellent ferroelectric properties. The grain size of the oxide included in the ferroelectric layer is reduced as well. As a result, a reduction in device size is achieved.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings.

Figure 1:
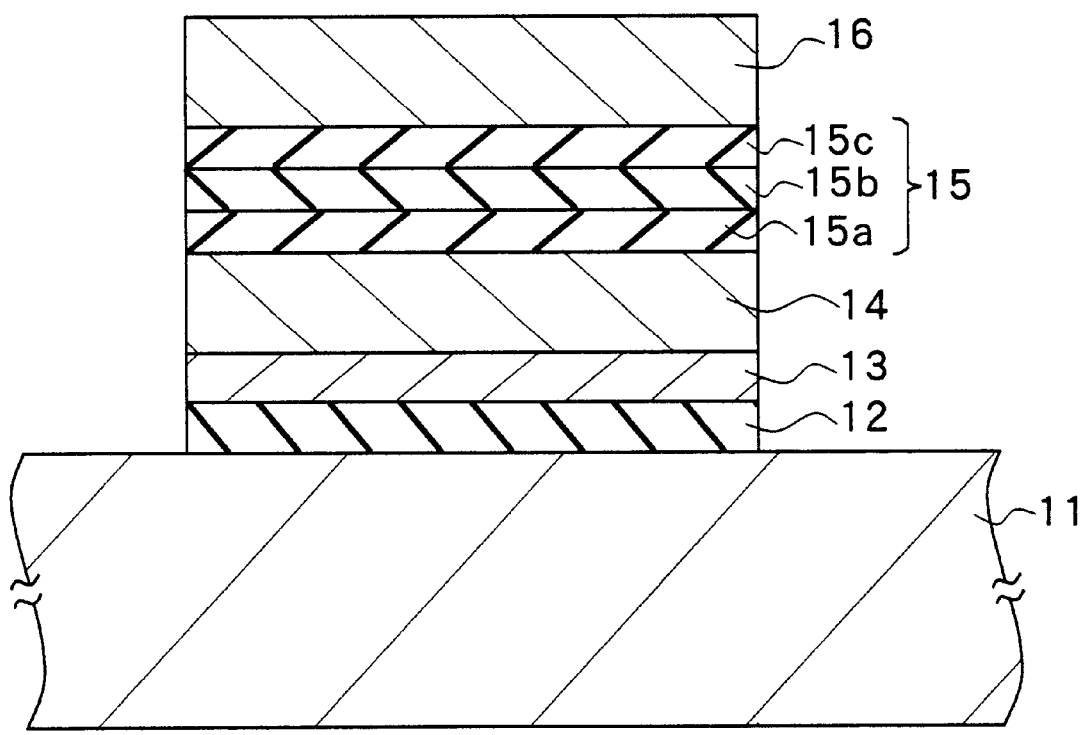
FIG. 1 is a schematic cross section of a ferroelectric capacitor of an embodiment of the invention.

FIG. 1 is a schematic cross section of a ferroelectric capacitor of an embodiment of the invention. The ferroelectric capacitor comprises a lower electrode 14, a ferroelectric layer 15 and an upper electrode 16 stacked on a substrate 11 of silicon (Si), for example, with a diffusion preventing layer 12 of silicon dioxide ($SiO_2$), for example, and a bonding layer 13 of titanium (Ti), for example, in between. That is, the ferroelectric capacitor comprises the ferroelectric layer 15 and the pair of electrodes 14 and 16 connected to the ferroelectric layer 15.

The lower electrode 14 and the upper electrode 16 are each made of a material selected from the group consisting of platinum (Pt), iridium (Ir), ruthenium (Ru), rhodium (Rh) and palladium (Pd) or an alloy of two or more selected from the group.

The ferroelectric layer 15 includes a plurality of stacked layers (three layers of a first layer 15a, a second layer 15b and a third layer 15c in FIG. 1). The layers 15a, 15b and 15c each include a polycrystalline oxide of layered crystal structure with ferroelectricity. Preferably, 85 percent or more of the layers 15a, 15b and 15c are each made up of the crystal phases of oxide of layered crystal structure. It is preferable that 85 percent or more of the ferroelectric layer 15 as a whole is at least made up of the crystal phase of oxide of layered crystal structure. Desirable ferroelectric properties are thereby achieved.

The oxide of the layered crystal structure is made up of bismuth, a first element, a second element and oxygen. The first element is at least one selected from the group consisting of strontium, calcium and barium. The second element is at least one selected from the group consisting of tantalum and niobium. Strontium is most preferable for the first element so as to achieve particularly excellent ferroelectric properties.

The formula of the oxide of the layered crystal structure is represented by $Bi_x(Sr, Ca, Ba)_y(Ta, Nb)_2O_{9\pm d}$ where $1.70 \leq x \leq 2.50$, $0.60 \leq y \leq 1.20$ and $0 \leq d \leq 1.00$. In particular, it is preferable that y falls in the range of $0.70 \leq y \leq 1.10$. There is a relationship between the formula and the residual polarization value of the oxide. A high residual polarization value is achieved when the formula falls within the range. In terms of stoichiometrical composition, the crystal structure of the oxide is made up of layers of $[Bi_2O_2]^{2+}$ and layers of $[(Sr, Ca, Ba)_1(Ta, Nb)_2O_7]^{2-}$ alternately stacked.

The formulae of the layers 15a, 15b and 15c of the ferroelectric layer 15 are not identical with each other. That is, the proportion of the first element in at least one of the layers is different from those in the other layers. Consequently, the proportion of the first element varies in one direction (through the depth of the stacked layers) in the ferroelectric layer 15 as a whole. That is, the proportion of the first element varies in one direction in the oxide of layered crystal structure included in the ferroelectric layer 15. The variation in proportion of the first element is provided for both maintaining excellent ferroelectricity and reducing the crystal grain size of the oxide.

Preferably, the variation in proportion of the first element is such that the proportion increases or decreases from one side to the other of the ferroelectric layer 15. For example, when the proportion of the second element is 2, the proportion of the first element ranges from the least value from 0.7 to 0.9 to the most value from 0.9 to 1.1. That is, in the formula of the oxide, the value of 'y' ranges from the least value from 0.7 to 0.9 to the most value from 0.9 to 1.1. Alternatively, the proportion of the first element may vary in any other manner. For example, the proportion may be increased or reduced around the center.

The ferroelectric capacitor with such a structure functions as described below.

In the ferroelectric capacitor, polarization takes place in the ferroelectric layer 15 when voltage is applied between the upper electrode 16 and the lower electrode 14. Polarization does not take place in all the crystal grains in the oxides of the layered crystal structure included in the ferroelectric layer 15. Instead, polarization occurs in the grains having specific orientations. That is, stable ferroelectric properties are obtained when the grain size in the oxide is small and the number of the grains in the ferroelectric layer 15 is large. In the embodiment, since there is a variation in proportion of the first element in the ferroelectric layer 15, excellent ferroelectric properties are achieved and the grain size in the oxide is reduced. As a result, the ferroelectric capacitor stably exhibits excellent ferroelectric properties with its size reduced.

In the ferroelectric capacitor of the embodiment described so far, there is a variation in proportion of the first element in the ferroelectric layer 15. The grain size is thus reduced while ferroelectric properties as good as those obtained in related art technology are maintained. As a result, ferroelectric properties are stably obtained with the size of the capacitor reduced.

Such a ferroelectric capacitor may be manufactured as follows.

The substrate 11 made of silicon, for example, is utilized and a surface oxide layer thereof is removed. A silicon dioxide layer as the diffusion preventing layer 12 is then formed on the substrate 11 through thermal oxidation, for example. A titanium layer as the bonding layer 13 is deposited on the silicon dioxide layer through sputtering, for example. A platinum layer as the lower electrode 14 is then deposited on the titanium layer through sputtering, for example.

Next, a plurality of layers as the ferroelectric layer 15 (that is, the first layer 15a, the second layer 15b and the third layer 15c) are stacked on the lower electrode 14 through chemical vapor deposition (CVD), laser ablation, sol-gel, metal organic decomposition (MOD) and so on. The layers each include a polycrystalline oxide of layered crystal structure. The layers are formed such that the proportion of the first element in at least one of the layers is different from those in the other layers. For example, the proportion of the first element in the first layer 15a closer to the substrate 11 may be greater or smaller than those in the other layers. Instead, the proportion of the first element may be gradually increased or reduced from the first layer 15a closer to the substrate 11 to the third layer 15c opposite to the substrate 11. Alternatively, the proportion of the first element in the third layer 15c opposite to the substrate 11 may be greater or smaller than those in the other layers.

The ferroelectric layer 15 is thus formed on which a platinum layer as the upper electrode 16 is deposited through sputtering, for example. Etching is then performed through ion milling, for example. Formation of the ferroelectric capacitor shown in FIG. 1 is thereby completed.

In the method of manufacturing the ferroelectric capacitor of the embodiment described so far, the ferroelectric layer 15 is formed into a plurality of layers. The proportion of the first element in at least one of the layers is different from those in the other layers. As a result, a variation in proportion of the first element in the ferroelectric layer 15 is easily produced. The ferroelectric layer 15 with excellent ferroelectricity and sufficiently small crystal grains is thus obtained so as to implement the ferroelectric capacitor of the embodiment.

The ferroelectric capacitor of the embodiment may be used as part of a memory cell as described below.

Figure 2:
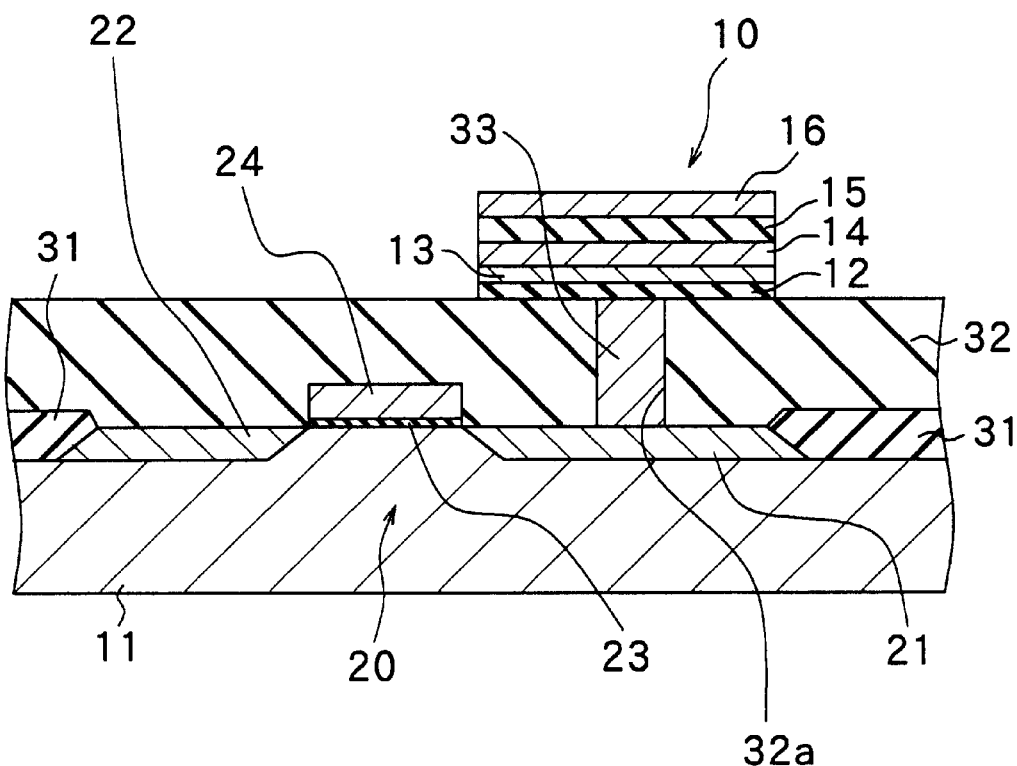
FIG. 2 is a cross section of a memory cell wherein the ferroelectric capacitor shown in FIG. 1 is utilized.

FIG. 2 is a cross section for illustrating an example of specific structure of a memory cell using a ferroelectric capacitor. The memory cell comprises a ferroelectric capacitor 10 of the embodiment and a transistor 20 for switching. The transistor 20 comprises an n+ source region 21 and an n+ drain region 22 formed with a space in a surface of the substrate 10 of p-type silicon, for example. A gate electrode 23 as a word line is formed between the source region 21 and the drain region 22 on the surface of the substrate 10 with a gate insulator 23 in between. A field oxide layer 31 for device isolation is formed around the transistor 20 in the surface of the substrate 11.

The ferroelectric capacitor 10 is formed on the transistor 20 with an interlayer insulator 32 in between. That is, the diffusion preventing layer 12, the bonding layer 13, the lower electrode 14, the ferroelectric layer 15 and the upper electrode 16 are stacked on the interlayer insulator 32. A contact hole 32a is provided in the interlayer insulator 32 for electrically connecting the source region 21 of the transistor 20 and the diffusion preventing layer 12 of the capacitor 10. A plug layer 33 made of poly-silicon or tungsten (W), for example, is buried in the contact hole 32a.

The memory cell functions as follows.

In the memory cell the transistor 20 is turned on when a voltage is applied to the gate electrode 24 of the transistor 20. A current then flows between the source region 21 and the drain region 22. A current is thereby fed to the capacitor 10 through the plug layer 33 and a voltage is applied between the upper electrode 16 and the lower electrode 14. On the application of a voltage, polarization takes place in the crystal grains having specific orientations in the oxides of the layered crystal structure included in the ferroelectric layer 15. The voltage-polarization characteristic has hysteresis. Data storage and readout of '1' or '0' is performed through the use of hysteresis. Since the capacitor 10 is the ferroelectric capacitor of the embodiment, the capacitor 10 operates in good condition with excellent ferroelectric properties. The crystal grain size of the oxide included in the ferroelectric layer 15 is reduced as well. As a result, satisfactory and stable operations are achieved with a reduction in device size.

As described so far, the memory cell using the ferroelectric capacitor of the embodiment achieves excellent ferroelectric properties and allows a reduction in crystal grain size of the oxide included in the ferroelectric layer 15. As a result, satisfactory and stable operations are achieved with a reduction in device size. Fabrication of high density and high integration device is thus achieved.

EXAMPLES

Examples in which the invention is implemented will now be described. Three examples will be described wherein $Bi_xSr_yTa_2O_9\pm_d$ is used for the oxide of the layered crystal structure and the proportion of strontium is varied.

In each example the substrate 11 made of silicon was utilized and a surface oxide layer thereof was removed. A silicon dioxide layer of 300 nm in thickness was then formed on the substrate 11 through thermal oxidation to form the diffusion preventing layer 12. A titanium layer of 30 nm in thickness was deposited on the diffusion preventing layer 12 through sputtering to form the bonding layer 13. A platinum layer of 200 nm in thickness was then deposited on the bonding layer 13 through sputtering to form the lower electrode 14.

Next, three layers (the first layer 15a, the second layer 15b and the third layer 15c) of 60 nm in thickness, each including $Bi_xSr_yTa_2O_9\pm_d$ were stacked on the lower electrode 14 to form the ferroelectric layer 15. The layers 15a, 15b and 15c were formed through a sol-gel method. Specifically, the formation was performed as follows. A solution for the first layer 15a was spin-coated on the lower electrode 14 to form a film. The film was then dried and underwent rapid thermal annealing (RTA) to be heated at a temperature of 600 to 800° C. in an oxygen atmosphere for 30 seconds. Next, a solution for the second layer 15b was spin-coated on the first layer 15a to be dried and undergo RTA. A solution for the third layer 15c was spin-coated on the second layer 15b to be dried and undergo RTA. The layers were then heated at a temperature of 800° C. in an oxygen atmosphere for one hour so that crystallization of the layers was accelerated. The layers 15a, 15b and 15c were thus formed.

The solutions used in the examples were 10 percent sol-gel solutions. The proportions of compositions of the solutions were varied among the examples as shown in table 1. In example 1, the proportion of strontium in the solution is 0.8 in the first layer only, which is less than 1.0 in the other layers, so that the proportion of strontium is reduced in the layer of the ferroelectric layer 15 closer to the substrate 11. In example 2, the proportion of strontium in the solution is 0.8 in the third layer only, which is less than 1.0 in the other layers, so that the proportion of strontium is reduced in the layer of the ferroelectric layer 15 opposite to the substrate 11. In example 3, the proportion of strontium in the solution is 1.0 in the first layer only, which is greater than 0.9 in the other layers, so that the proportion of strontium is increased in the layer of the ferroelectric layer 15 closer to the substrate 11. In each example the proportion of bismuth is fixed to 2.4 and that of tantalum to 2.0.

TABLE 1

|  | proportion of solution Bi: Sr: Ta third layer second layer first layer | residual polarization value 2Pr ($\mu$ C/ cm$^2$) | crystal grain size (mean surface area) ($\mu$ m$^2$) |
| --- | --- | --- | --- |
| example 1 | 2.4: 1.0: 2.0<br>2.4: 1.0: 2.0<br>2.4: 0.8: 2.0 | 20.0 | 0.015 |
| example 2 | 2.4: 0.8: 2.0<br>2.4: 1.0: 2.0<br>2.4: 1.0: 2.0 | 13.0 | 0.026 |
| example 3 | 2.4: 0.9: 2.0<br>2.4: 0.9: 2.0<br>2.4: 1.0: 2.0 | 18.0 | 0.021 |

The ferroelectric layer 15 was thus formed on which a platinum layer of 200 nm in thickness was formed through sputtering to form the upper electrode 16. Etching was then performed through ion milling. The ferroelectric capacitor was thus fabricated in each example.

Figure 3:
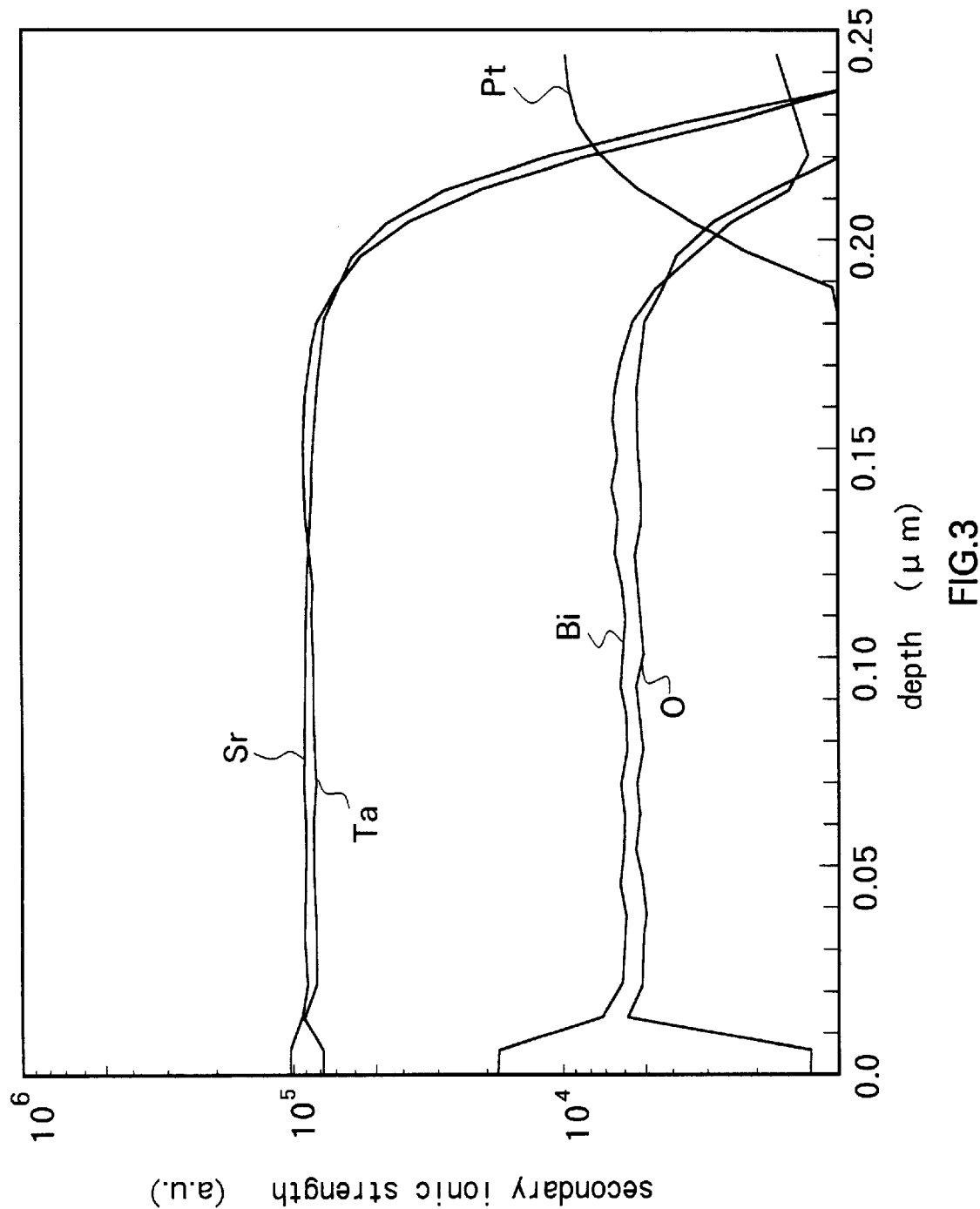
FIG. 3 is a plot for indicating the composition of a ferroelectric layer obtained in example 1 of the invention wherein the secondary ionic strength of each element is shown.

For the ferroelectric capacitor thus obtained in each example, an analysis was made on whether the proportion of strontium varied through the depth of the stacked layers 15a, 15b and 15c in the ferroelectric layer 15. The secondary ion mass spectrometry (SIMS) was used for the analysis. FIG. 3 shows the result of example 1. In FIG. 3 the depth around 0.12 to 0.18 $\mu$m corresponds to the first layer 15a. The depth around 0.06 to 0.12 $\mu$m corresponds to the second layer 15b. The depth around 0 to 0.06 $\mu$m corresponds to the third layer 15c. As shown, the proportion of strontium in the first layer was less than those in the other layers 15b and 15c, that is, there was a variation similar to the variation in the compositions of the solutions. Although the results of examples 2 and 3 are not shown, there were variations similar to the variations in the compositions of the solutions.

Figure 4:
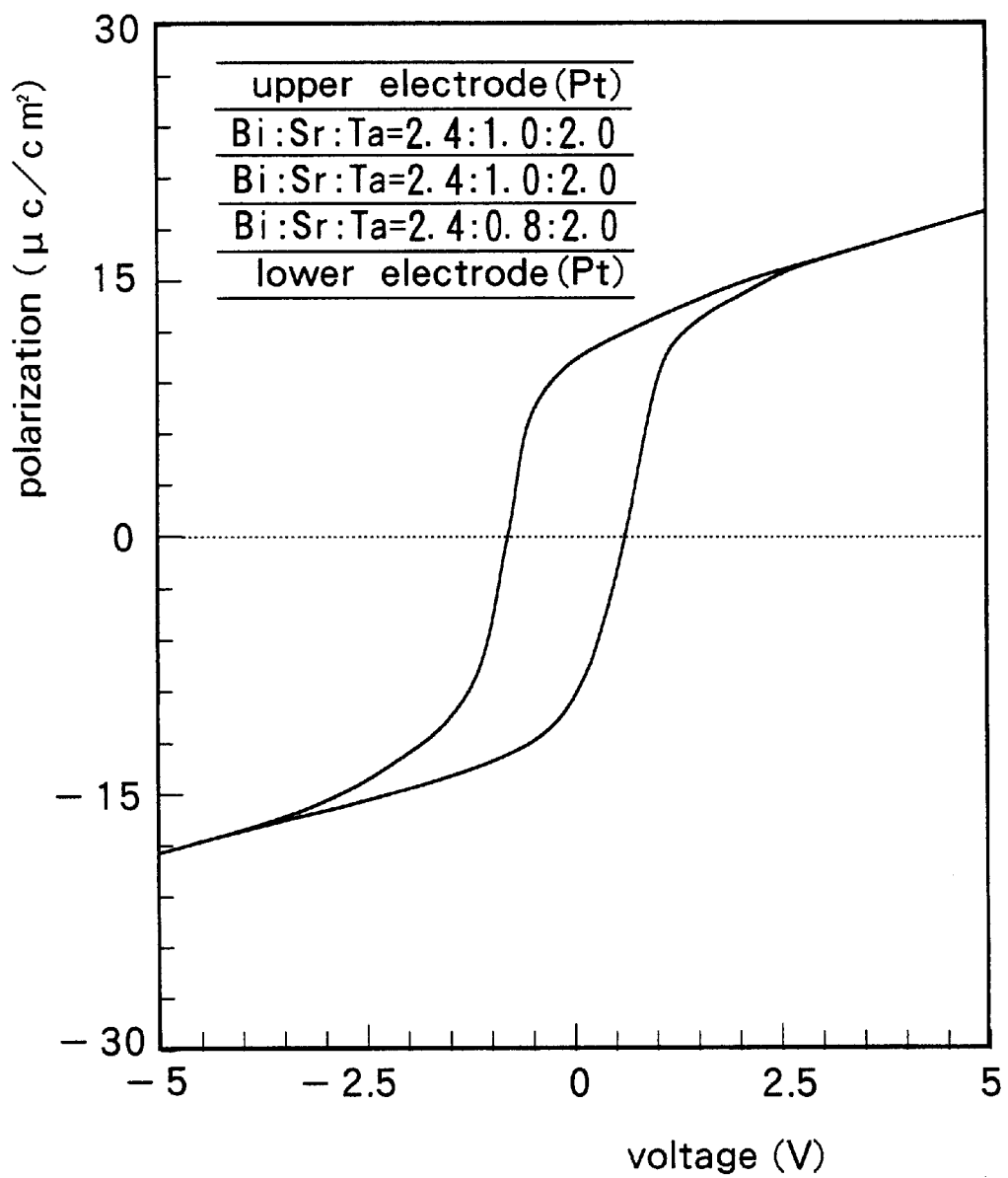
FIG. 4 is a plot for indicating the ferroelectric hysteresis curve of a ferroelectric capacitor obtained in example 1 of the invention.
Figure 5:
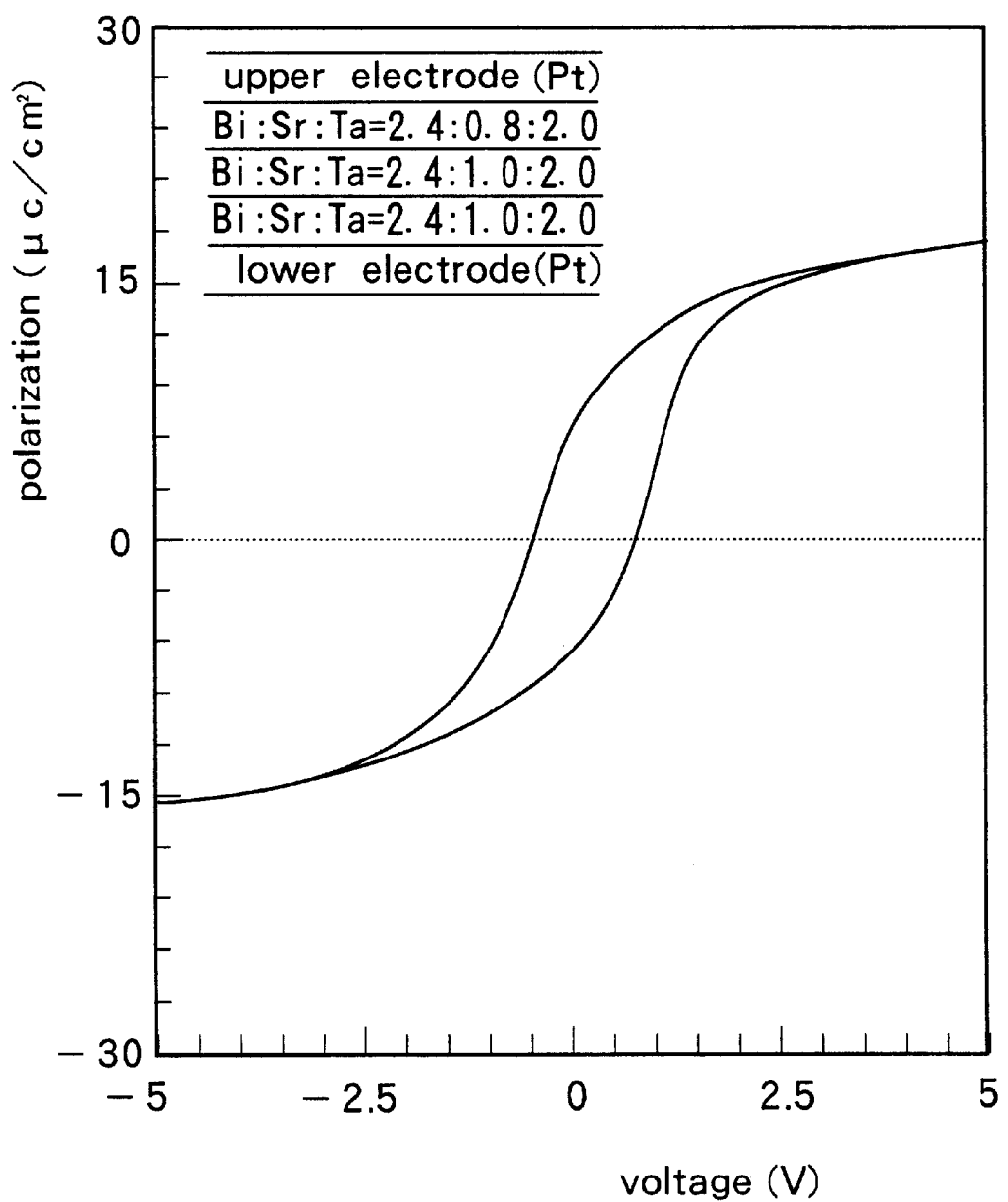
FIG. 5 is a plot for indicating the ferroelectric hysteresis curve of a ferroelectric capacitor obtained in example 2 of the invention.
Figure 6:
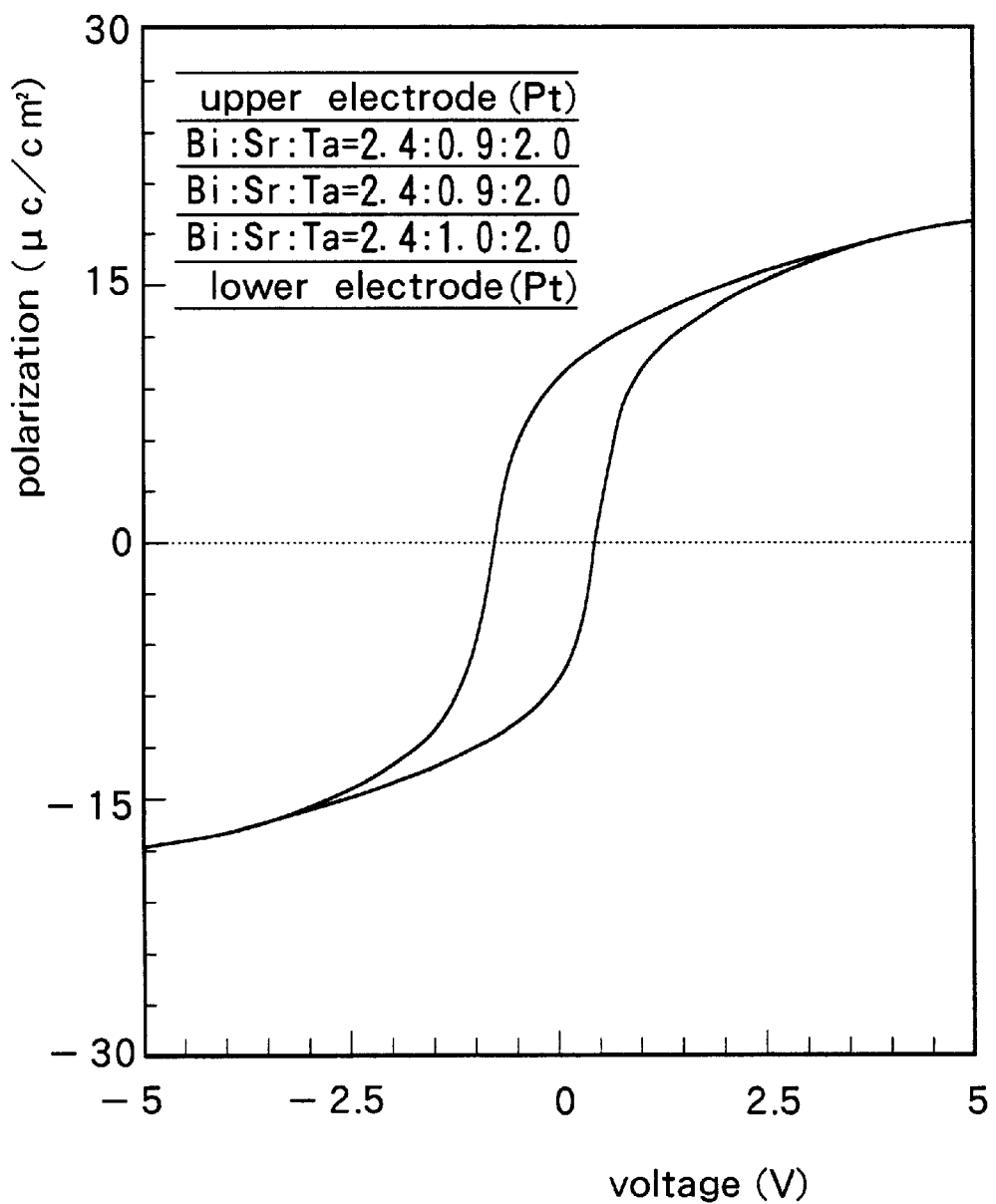
FIG. 6 is a plot for indicating the ferroelectric hysteresis curve of a ferroelectric capacitor obtained in example 3 of the invention.

In each example ferroelectric hysteresis and the sizes of crystal grains (crystal grains of Bi$_x$Sr$_y$Ta$_2$O$_{9\pm d}$) included in the ferroelectric layer 15 were observed. Ferroelectric hysteresis was observed by applying a voltage of 5 V between the upper electrode 16 and the lower electrode 14. The crystal grain sizes were observed with a scanning electron microscope (SEM) and a mean value of surface areas of grains was determined. FIG. 4 to FIG. 6 and table 1 show the results.

FIG. 4, FIG. 5 and FIG. 6 each show the ferroelectric hysteresis curves of the ferroelectric capacitors obtained in examples 1, 2 and 3, respectively. The residual polarization values (2Pr) were determined from the hysteresis curves. The values were 20.0 $\mu$C/cm$^2$ in example 1, 13.0 $\mu$C/cm$^2$ in example 2 and 18.0 $\mu$C/cm$^2$ in example 3.

The crystal grain sizes (the mean surface areas) were 0.015 $\mu$m$^2$ in example 1, 0.026 $\mu$m$^2$ in example 2 and 0.021 $\mu$m$^2$ in example 3.

Figure 7:
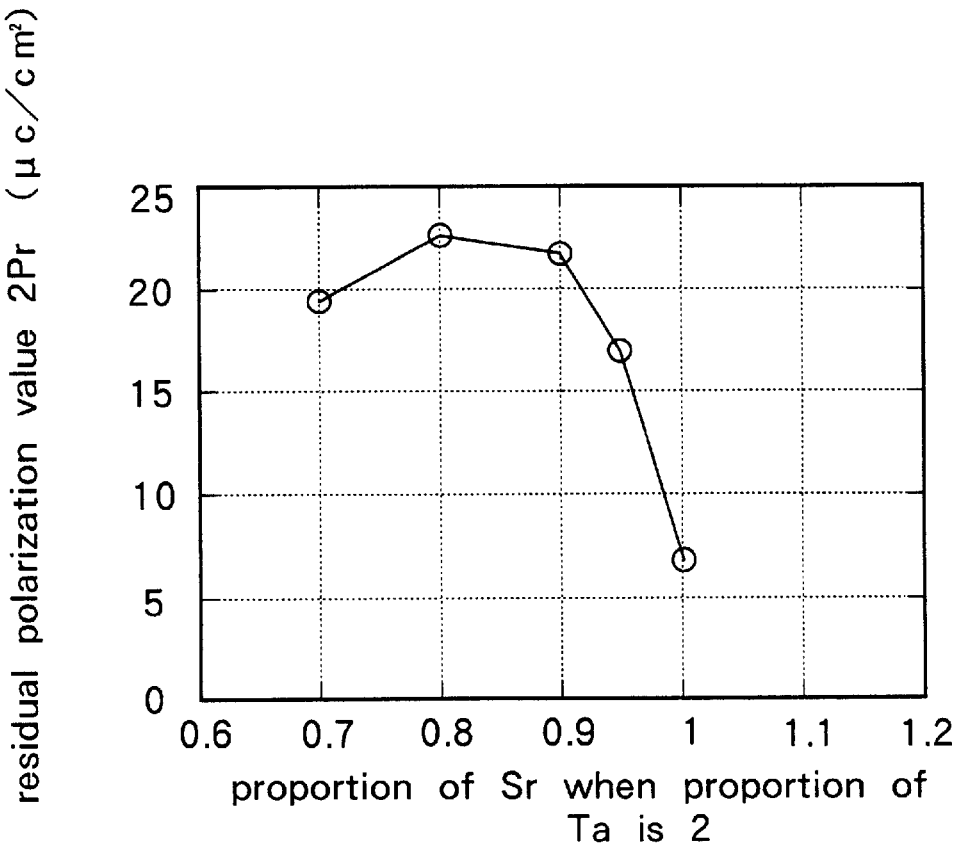
FIG. 7 is a plot for indicating examples to be compared with the examples of the invention wherein the relationship between the proportions of strontium in a ferroelectric layer and the residual polarization values is shown.
Figure 8:
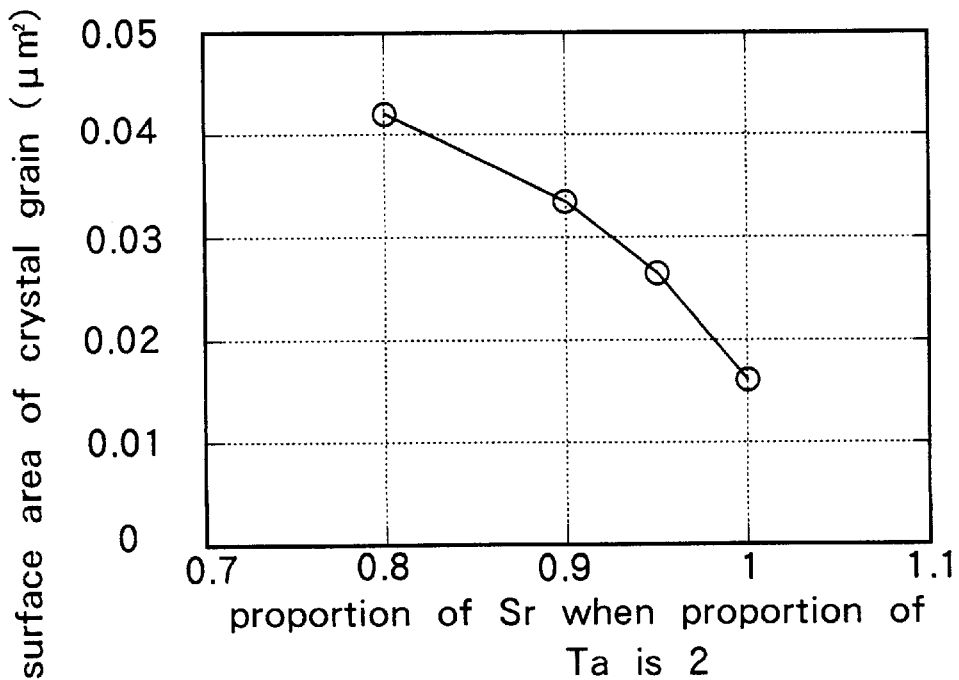
FIG. 8 is a plot for indicating the examples to be compared with the examples of the invention wherein the relationship between the proportions of strontium in a ferroelectric layer and the surface areas of crystal grains is shown.

FIG. 7, FIG. 8 and table 2 show the relationship between proportions of strontium in ferroelectric layers, residual polarization values (2Pr) and crystal grain sizes of ferroelectric capacitors of related art as examples to be compared with the examples of the invention. The capacitors used in the comparison examples had structures similar to those of the capacitors of the examples of the invention except that the proportions of strontium in the ferroelectric layers were uniform.

TABLE 2

|  | proportion of solution Bi: Sr: Ta | residual polarization value 2Pr ($\mu$ C/ cm$^2$) | crystal grain size (mean surface area) ($\mu$ m$^2$) |
| --- | --- | --- | --- |
| comparison example 1 | 2.4: 0.8: 2.0 | 22.7 | 0.042 |
| comparison example 2 | 2.4: 0.9: 2.0 | 21.8 | 0.033 |
| comparison example 3 | 2.4: 0.95: 2.0 | 17.0 | 0.026 |
| comparison example 4 | 2.4: 1.0: 2.0 | 6.8 | 0.016 |

As shown in FIG. 7, the residual polarization value (2Pr) was greatest when the proportion of strontium was 0.8 in the related art capacitor. The residual polarization value decreased as the proportion of strontium shifted from 0.8 to 1 which is the stoichiometric proportion. As shown in FIG. 8, the surface area of crystal grain was reduced as the proportion of strontium shifted from 0.8 to 1 which is the stoichiometric proportion. That is, in the related art capacitor, the surface area of crystal grain was reduced as the proportion of strontium shifted from 0.8 to 1. However, the residual polarization value was reduced as well (see table 2).

In contrast, the residual polarization value increased as the surface area of crystal grain was reduced (see table 1). In example 1, in particular, the grain size was reduced to a desirable value while the residual polarization value was maintained at a value as high as that obtained with the related art ferroelectric capacitor. That is, the crystal grain size was reduced while excellent ferroelectric properties were maintained by providing a variation in proportion of strontium in the ferroelectric layer 15.

The present invention is not limited to the embodiment and examples described so far but may be practiced in still other ways. For example, although Bi$_x$Sr$_y$Ta$_2$O$_{9\pm d}$ is used for the oxide of the layered crystal structure included in the ferroelectric layer 15 in the foregoing examples, similar effects will be achieved with any other oxide of the layered crystal structure made up of bismuth, a first element, a second element and oxygen wherein the first element is at least one selected from the group consisting of strontium, calcium and barium and the second element is at least one selected from the group consisting of tantalum and niobium.

Although the memory cell using the ferroelectric capacitor is specifically described in the foregoing embodiment, the ferroelectric capacitor of the invention may be applied to a memory cell with any other configuration. For example, although the ferroelectric capacitor 10 and the transistor 20 are arranged orthogonal to the substrate 11 in the memory cell of the embodiment, the invention may be applied to a memory cell wherein a capacitor and a transistor are placed side by side in parallel with a substrate.

Although the ferroelectric capacitor of the invention is used in a single memory cell in the foregoing embodiment, the invention may be similarly applied to a large scale integration (LSI) memory wherein a plurality of memory cells are integrated.

In the ferroelectric capacitor of the invention described so far, there is a variation in proportion of the first element in the ferroelectric layer. The crystal grain size is thereby reduced while excellent ferroelectricity is maintained. As a result, excellent ferroelectric properties are stably obtained with the size of the capacitor reduced.

In the method of manufacturing the ferroelectric capacitor of the invention, the ferroelectric layer is formed into a plurality of layers. The proportion of the first element in at least one of the layers is different from those of the other layers. As a result, a variation in proportion of the first element in the ferroelectric layer is easily produced. The ferroelectric layer with excellent ferroelectricity and sufficiently small crystal grains is thus obtained so as to implement the ferroelectric capacitor of the invention.

In the memory cell of the invention, the ferroelectric capacitor is used wherein there is a variation in proportion of the first element in the ferroelectric layer. Operations in good condition are thereby achieved through excellent ferroelectric properties. The crystal grain size of the oxide included in the ferroelectric layer is reduced as well. As a result, satisfactory and stable operations are achieved with a reduction in device size. Fabrication of high density and high integration device is thus achieved.

Obviously many modifications and variations of the present invention are possible in the light of the above teachings. It is therefore to be understood that within the scope of the appended claims the invention may be practiced otherwise than as specifically described.

What is claimed is:

1. A ferroelectric capacitor comprising a ferroelectric layer to which a pair of electrodes are connected wherein:
   the ferroelectric layer includes an oxide of a layered crystal structure consisting of bismuth (Bi), oxygen, at least one first element selected from the group consisting of strontium (Sr), calcium (Ca) and barium (Ba), and at least one second element selected from the group consisting of tantalum (Ta) and niobium (Nb) with a formula of the oxide being represented by $Bi_x(Sr, Ca, Ba)_y(Ta, Nb)_2O_{9\pm d}$, wherein $1.70 \leq x \leq 2.50$, $0.60 \leq y \leq 1.20$ and $0 \leq d \leq 1.00$ and the first element of the ferroelectric layer having a variation of proportions in one direction so that the proportion changes from one side of the ferroelectric layer to the other side.

2. A ferroelectric capacitor according to claim 1, the ferroelectric capacitor being formed on a substrate wherein:
   the proportion of the first element increases from a side close to the substrate to a side opposite to the substrate.

3. A ferroelectric capacitor according to claim 2, wherein the proportion of the first element is such that the value of 'y' in the formula falls in the range of 0.7 to 0.9 inclusive on the side close to the substrate and the range of 0.9 to 1.1 inclusive on the side opposite to the substrate.

4. A ferroelectric capacitor according to claim 1, the ferroelectric capacitor being formed on a substrate wherein:
   the proportion of the first element decreases from a side close to the substrate to a side opposite to the substrate.

5. A ferroelectric capacitor according to claim 4, wherein the proportion of the first element is such that the value of 'y' in the formula falls in the range of 0.9 to 1.1 inclusive on the side close to the substrate and the range of 0.7 to 0.9 inclusive on the side opposite to the substrate.

6. A ferroelectric capacitor according to claim 1 wherein the first element is strontium (Sr).

7. A ferroelectric capacitor according to claim 1 wherein 85 percent or more of the ferroelectric layer consists of a crystal phase of the oxide of layered crystal structure.

8. A method of manufacturing a ferroelectric capacitor comprising a ferroelectric layer to which a pair of electrodes are connected, the ferroelectric layer including an oxide of a layered crystal structure consisting of bismuth (Bi), oxygen, at least one first element selected from the group consisting of strontium (Sr), calcium (Ca) and barium (Ba), and at least one second element selected from the group consisting of tantalum (Ta) and niobium (Nb), with a formula of the oxide being represented by $Bi_x(Sr, Ca, Ba)_y(Ta, Nb)_2O_{9\pm d}$, wherein $1.70 \leq x \leq 2.50$, $0.60 \leq y \leq 1.20$ and $0 \leq d \leq 1.00$, including the step of:
   forming the ferroelectric layer by stacking a plurality of layers of the oxide, and varying the proportions of the first element in the layers so that the proportions change from one side of the ferroelectric layer to the other side.

9. A method according to claim 8, the ferroelectric capacitor being formed on a substrate wherein:
   the proportion of the first element increases from a side close to the substrate to a side opposite to the substrate.

10. A method according to claim 9, wherein the proportion of the first element is such that the value of 'y' in the formula falls in the range of 0.7 to 0.9 inclusive on the side close to the substrate and the range of 0.9 to 1.1 inclusive on the side opposite to the substrate.

11. A method according to claim 8, wherein the ferroelectric capacitor being formed on a substrate wherein:
   the proportion of the first element decreases from a side close to the substrate to a side opposite to the substrate.

12. A method according to claim 11, wherein the proportion of the first element is such that the value of 'y' in the formula falls in the range of 0.9 to 1.1 inclusive on the side close to the substrate and the range of 0.7 to 0.9 inclusive on the side opposite to the substrate.

13. A method according to claim 8, wherein the first element is strontium (Sr).

14. A method according to claim 8, wherein 85 percent or more of the ferroelectric layer consists of a crystal phase of the oxide of layered crystal structure.

15. A memory cell including a ferroelectric capacitor comprising a ferroelectric layer to which a pair of electrodes are connected wherein:
   the ferroelectric layer includes an oxide of a layered crystal structure consisting of bismuth (Bi), oxygen, at least one first element selected from the group consisting of strontium (Sr), calcium (Ca) and barium (Ba), and at least one second element selected from the group consisting of tantalum (Ta) and niobium (Nb), with a formula of the oxide being represented by $Bi_x(Sr, Ca, Ba)_y(Ta, Nb)_2O_{9\pm d}$, wherein $1.70 \leq x \leq 2.50$, $0.60 \leq y \leq 1.20$ and $0 \leq d \leq 1.00$ and the first element of the ferroelectric layer having a variation of proportions in one direction so that the proportion changes from one side of the ferroelectric layer to the other side.

16. A memory cell according to claim 15, wherein the ferroelectric capacitor being formed on a substrate wherein:
   the proportion of the first element increases from a side close to the substrate to a side opposite to the substrate.

17. A memory cell according to claim 16 wherein the proportion of the first element is such that the value of 'y' in the formula falls in the range of 0.7 to 0.9 inclusive on the side close to the substrate and the range of 0.9 to 1.1 inclusive on the side opposite to the substrate.

18. A memory cell according to claim 15, wherein the ferroelectric capacitor being formed on a substrate wherein:

the proportion of the first element decreases from a side close to the substrate to a side opposite to the substrate.

19. A memory cell according to claim 18, wherein the proportion of the first element is such that the value of 'y' in the formula falls in the range of 0.9 to 1.1 inclusive on the side close to the substrate and the range of 0.7 to 0.9 inclusive on the side opposite to the substrate.

20. A memory cell according to claim 15, wherein the first element is strontium (Sr).

21. A memory cell according to claim 15, wherein 85 percent or more of the ferroelectric layer consists of a crystal phase of the oxide of layered crystal structure.

* * * * *